United States Patent
Jurisch et al.

[11] Patent Number: 6,104,182
[45] Date of Patent: Aug. 15, 2000

[54] METHOD OF DERIVING A SIGNAL INDICATING AN OSCILLATION IN AN ELECTRIC POWER SUPPLY SYSTEM

[75] Inventors: Andreas Jurisch, Berlin; Micheal Schwenke, Hönoe, both of Germany

[73] Assignee: Siemens AG, Munich, Germany

[21] Appl. No.: 09/170,889

[22] Filed: Oct. 13, 1998

[30]         Foreign Application Priority Data

Oct. 15, 1997   [DE]   Germany ............................ 197 46 719

[51] Int. Cl.$^7$ ....................................................... G01R 7/00
[52] U.S. Cl. ........................ 324/142; 324/141; 324/140 R
[58] Field of Search ................................ 324/142, 140 R, 324/141; 702/60, 57

[56]                References Cited

U.S. PATENT DOCUMENTS

| | | | |
|---|---|---|---|
| 3,959,724 | 5/1976 | Chana et al. ............................... | 324/142 |
| 4,055,803 | 10/1977 | Kraley et al. ............................ | 324/142 |
| 4,197,582 | 4/1980 | Johnston et al. ........................ | 324/142 |
| 4,931,725 | 6/1990 | Hutt et al. ................................ | 324/142 |

FOREIGN PATENT DOCUMENTS

| | | |
|---|---|---|
| 41 00 646 | 9/1992 | Germany . |
| 1 95 03 626 | 8/1996 | Germany . |

OTHER PUBLICATIONS

*A. Jurisch, "Digitale Impedanzmessverahren auf der Basis von Identifikationsmethoden" [Digital Impedance Measurement Methods Based on Identification Methods], TH Zittau, 1990, pp. 58–70. (no month).

* Jahn et al., "Koordinatentransformationen zur Behandlung von Mehrphasensystemen" [Coordinate Transforms for the Treatment of Multi–Phase Systems], *Archiv für Elektrotechnik* [Archives for Electrical Engineering], Archive for Electrical Technology, Springer Verlag, vol. 56, 1974, pp. 105–11. (no month).

*Primary Examiner*—Josie Ballato
*Assistant Examiner*—Jermele M. Hollington
*Attorney, Agent, or Firm*—Kenyon & Kenyon

[57]                ABSTRACT

Current and voltage space vectors of the positive sequence system are formed from phase current and phase voltage sampling values of an electric power supply system, and power quantities of the positive sequence system are derived from them. System frequency components are eliminated from these power quantities by a least squares estimate, thus forming a measured active power quantity of the positive sequence system and a measured reactive power quantity of the positive sequence system. By forming quotients with a measured current quantity of the positive sequence system, also obtained using the least squares estimate, impedance values of the positive sequence system are also obtained. These are tested for monotony and abrupt changes and a suspected oscillation signal is formed, if applicable. In addition, to obtain an oscillation confirmation signal, the respective center point of the circle of the trajectory formed by the impedance values of the positive sequence system is determined and compared with the reactance value of the positive sequence system with regard to its imaginary part. If a suspected oscillation signal and an oscillation confirmation signal occur simultaneously, the oscillation signal is formed.

2 Claims, 5 Drawing Sheets

METHOD OF DERIVING A SIGNAL INDICATING AN OSCILLATION IN AN ELECTRIC POWER SUPPLY SYSTEM

FIELD OF THE INVENTION

The present invention relates to a method for deriving a signal (e.g., oscillation signal) indicating oscillation in an electric power supply system.

BACKGROUND INFORMATION

German Patent Application No. 195 03 626 describes a conventional method where impedance values are formed from current and voltage sampling values at predetermined intervals in response to an excitation. The size of its change in time is determined from the first impedance value falling in an oscillation polygon and from the preceding impedance value, and a suspected oscillation signal is generated when the change is below a predetermined limit value. If an impedance value falling in the triggering polygon of an impedance protection is obtained in further review of the impedance values, the oscillation signal is generated if the suspected oscillation signal still exists. Oscillations with a frequency up to 1 Hz at most can be detected by this method.

German Patent No. 41 00 646 describes a method and an arrangement for protecting impedance protection devices from unwanted tripping during transient power oscillations where at least one blocking signal is generated for the impedance protection device by time derivation of a power-based electric quantity, and unwanted tripping of the impedance protection device is prevented by using an impedance locus diagram, but the resulting changes in active power and reactive power are related to the apparent power after forming the difference, and this quotient is used to form an oscillation signal.

SUMMARY OF THE INVENTION

An object of the present invention is to provide a method for obtaining an oscillation signal with which higherfrequency oscillations can be detected.

To achieve this object, current and voltage space vectors of the positive phase-sequence system of the power supply system are formed according to the present invention from the phase current and voltage sampling values. A positive sequence system active power quantity, which is proportional to the instantaneous value of the active power of the positive sequence system, is formed together with a reactive power quantity of the positive sequence system which is proportional to the reactive power of the positive sequence system. By a least-squares estimate, system frequency components are eliminated from the positive sequence system active power quantity, thus forming an active power measured quantity, and, from the positive sequence system reactive power, forming a reactive power measured quantity. Furthermore, a current quantity of the positive sequence system is formed from the current space vectors of the positive sequence system. A measured current quantity of the positive sequence system is formed from the current quantity of the positive sequence system by a least-squares estimate. Resistance values of the positive sequence system are obtained by forming the quotient of the measured active power quantity and the squared measured current quantity of the positive sequence system. Reactance values of the positive sequence system are obtained by forming the quotient of the measured reactive power quantity and the squared measured current quantity of the positive sequence system. Chronologically successive impedance values of the positive sequence system formed from resistance and reactance values of the positive sequence system correlating with one another in time are subjected to a check for monotony and a check for sudden changes. If they are found to be monotonic and without sudden changes, a suspected oscillation signal is formed. Furthermore, a circle center point of a trajectory formed by impedance values of a positive sequence system with respect to the respective impedance value of the positive sequence system is formed from the impedance values of the positive sequence system by estimation. An oscillation confirmation signal is generated when the imaginary component of the center point of the circle exceeds the absolute value of the positive sequence system reactance value of the respective positive sequence system impedance. If a suspected oscillation signal and an oscillation confirmation signal occur simultaneously, the oscillation signal is formed if the impedance value of the positive sequence system formed last is within the oscillation polygon.

One advantage of the method according to the present invention is that it permits rapid detection of oscillations, where the oscillations can be clearly differentiated from three-phase faults. In addition, the method according to the present invention makes it possible to detect relatively high-frequency oscillations, even when the load angle changes non-uniformly over time. Another important advantage of the method according to the present invention is that the trajectory formed from chronologically successive positive sequence system impedance values is smoothed very well because of the least squares estimate and thus can be adequately analyzed.

In the method according to the present invention, chronologically successive positive sequence system resistance values are monitored to advantage for whether a minimum rate of change is maintained when positive sequence system impedance values formed by chronologically correlated positive sequence system resistance and reactance values lie within the oscillation polygon, and the oscillation signal is canceled if the rate is lower than this minimum rate of change.

DETAILED DESCRIPTION

Figure 1:
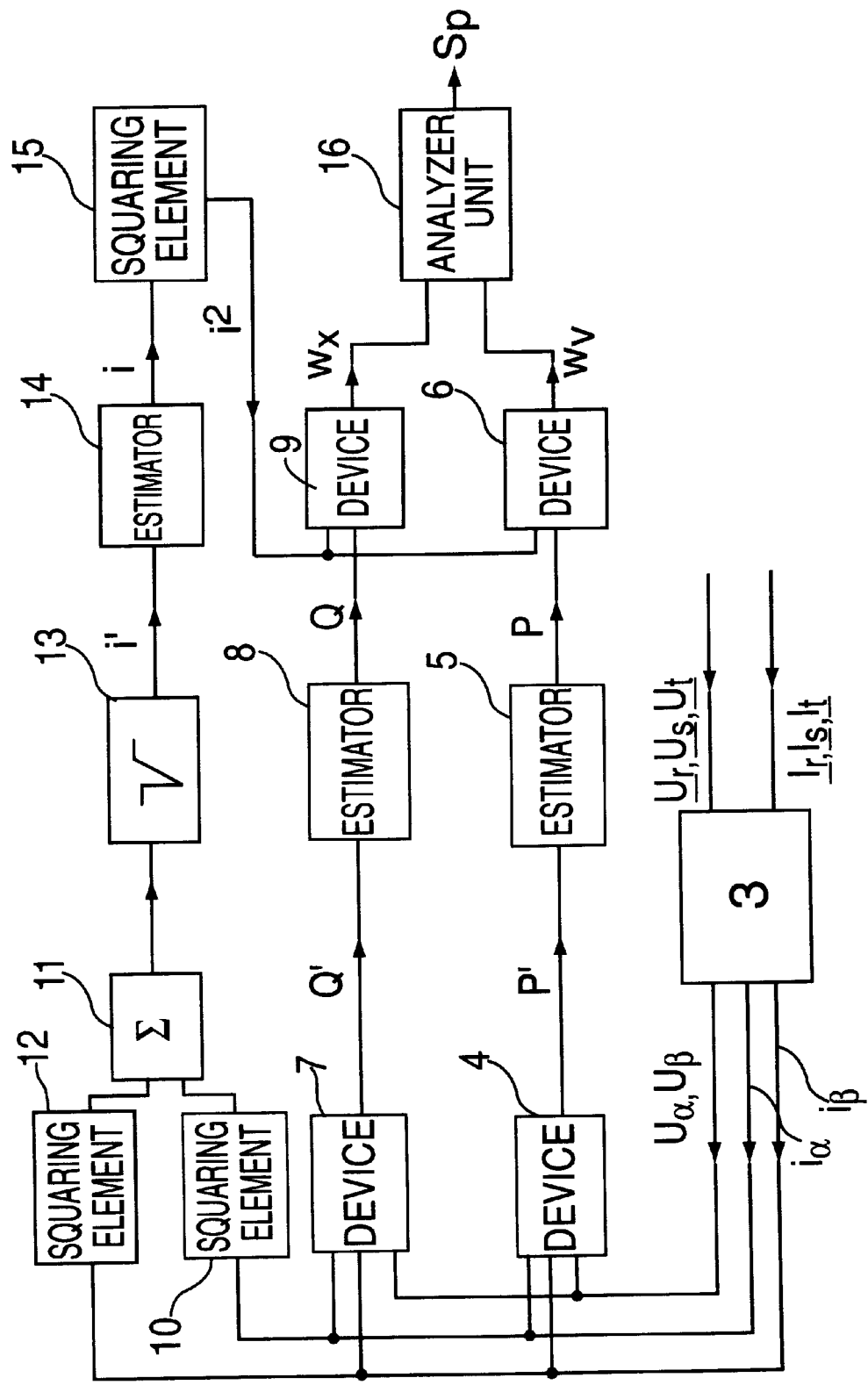
FIG. 1 shows an exemplary embodiment of an arrangement for carrying out a method according to the present invention.

FIG. 1 shows a device 3 for forming current and voltage space vectors. The device is connected at the input end to three phases of a three-phase electric power supply line via current and voltage transformers in a manner not shown here. Device 3 for forming space vectors is connected at the output end to a device 4 for forming an active power quantity P' of a positive sequence system, with a least squares estimator 5 connected at the output end downstream from device 4. At its output, least squares estimator 5 is connected to one input of a quotient forming device 6. In addition, a device 7 for forming a reactive power quantity Q' of a positive sequence system is also connected to device 3, with another least squares estimator 8 connected downstream from device 7. A measured reactive power Q supplied at the output of this additional estimator 8 is sent via an input to another quotient forming device 9.

Current space vector $i_\alpha$ of device 3 is squared in a squaring element 10 having a downstream summing unit 11. Another squaring element 12 is connected to the input of summing unit 11 and receives at its input additional current space vector $i_\beta$ of device 3. A square root extractor unit 13 is connected to the output of summing unit 11 and has a least squares estimator 14 connected downstream. Square root extractor unit 13 generates a positive sequence system quantity i' from which a positive sequence system measured quantity i is formed by least squares estimator 14. Least squares estimator 14 is connected to additional inputs of quotient forming devices 6 and 9 via a squaring element 15.

Positive sequence system resistance values Wr are formed by quotient forming device 6 and positive sequence system reactance values Wx are formed by additional quotient forming device 9 and sent to an analyzer unit 16 which delivers, if appropriate, an oscillation signal Sp at its output.

Signal Sp can be generated as follows with the arrangement according to FIG. 1:

First, to form current and voltage space vectors, phase currents Ir, Is, It and phase voltages Ur, Us, Ut of the power supply system (not shown; formed by a three-phase power transmission line, for example) are sampled in device 3, forming phase current and phase voltage sampling values ur, us, ut, ir, is and it. These sampling values are subjected to an hαβ transform (Clarke transform), so that transformed current sampling values and current space vectors iα, iβ and transformed voltage sampling values and voltage space vectors uα and uβ of the positive sequence system can be determined (see Jahn et al., "Koordinatentransformationen zur Behandlung von Mehrphasensystemen" [Coordinate Transforms for Treatment of Multi-Phase Systems], *Archiv für Elektrotechnik* [Archives for Electrical Engineering], Vol. 56, 1974, pp. 105–11):

$$i_\alpha = \sqrt{\frac{2}{3}} \cdot (i_R - 0.5 \cdot (i_S + i_T)) \quad (1)$$

$$i_\beta = \sqrt{\frac{1}{2}} \cdot (i_S - i_T)$$

$$u_\alpha = \sqrt{\frac{2}{3}} \cdot (u_R - 0.5 \cdot (u_S + u_T))$$

$$u_\beta = \sqrt{\frac{1}{2}} \cdot (u_S - u_T)$$

In device 4, an active power quantity P' of the positive sequence system proportional to the instantaneous active power of the positive sequence system is formed from these transformed sampling values and space vectors according to the following equation:

$$p' = \tfrac{1}{2} \cdot (u_\alpha i_\alpha + u_\beta i_\beta) \quad (2)$$

It is also assumed that in the event of a short-circuit or a system oscillation, the curve of active power quantity P' of the positive sequence system as a function of time can be described by the following signal model:

$$y_i = A \cdot e^{\frac{i \cdot T_A}{\tau}} \cdot \sin(\overline{\omega}_0 i \cdot T_A) + B \cdot e^{\frac{i \cdot T_A}{\tau}} \cdot \cos(\omega_0 i \cdot T_A) + C \quad (3)$$

where $y_i$ denotes sampling values of the current and voltage space vectors, τ denotes a time constant (explained below), $\omega_O$ is the system frequency and $T_A$ is the sampling period.

In the case when considering the active power quantity of the positive sequence system, the first term in the equation describes a sinusoidal signal component of the active power quantity P' of the positive sequence system, said component oscillating at the system frequency and decaying exponentially over time. The second term describes another signal component of the active power quantity P' of the positive sequence system, the component likewise oscillating at the system frequency and decaying exponentially over time, with the one signal component and the other being orthogonal to one another, because the additional signal component is cosinusoidal. C denotes a component measured value of active power quantity P' of the positive sequence system, the component measured value C oscillating at an oscillation frequency and being dependent on time, and therefore characterizing an instantaneous value.

The signal model according to equation (3) is based on the assumption that in a three-phase short-circuit, practically no active power and thus no positive sequence system active power is being converted, so that active power quantity P' of the positive sequence system must drop to a very small value—almost zero—in such a short-circuit. This drop in active power quantity P' of the positive sequence system is taken into account by the first two terms in equation (3). The signal model according to equation (3) also takes into account power oscillations, i.e., through the third term and swing component measured value C. Swing component measured value C takes into account those frequency components in active power quantity P' of the positive sequence system that are below the system frequency and are thus characteristic of system oscillations.

Active power quantity P' of the positive sequence system is transmitted to least squares estimator 5 where the system frequency components in active power quantity P' of the positive sequence system are removed and a measured active power quantity P of the positive sequence system is formed. This measured active power quantity P of the positive sequence system corresponds to swing component measured value C of active power quantity P' of the positive sequence system oscillating at an oscillating frequency.

Similarly, measured reactive power quantity Q of the positive sequence system is formed by device 7 and additional least squares estimator 8 from reactive power quantity Q' of the positive sequence system, which is formed according to the following equation (4). Measured reactive power quantity Q of the positive sequence system also corresponds to swing component measured value C of reactive power quantity Q' of the positive sequence system.

$$Q' = \tfrac{1}{2}(u_\beta i_\alpha - i_\alpha i_\beta) \qquad (4)$$

With modules 10 to 13 according to FIG. 1, a current quantity i' of the positive sequence system is formed according to equation (5):

$$i' = \sqrt{i_\alpha^2 + i_\beta^2} \qquad (5)$$

measured current quantity i, corresponding to swing component value C in current quantity i' of the positive sequence system, is formed from this current quantity, using the signal model given above, by least squares estimate in module 14.

Resistance values Wr and reactance values Wx of the positive sequence system are obtained by forming the quotients in quotient forming devices 6 and 9:

$$Wr = \frac{P}{i^2} \qquad (6)$$

$$Wx = \frac{Q}{i^2} \qquad (7)$$

these values are then processed in analyzer unit 16.

Before discussing details, the procedure in the least squares estimate will be explained in greater detail.

The estimation method calculates coefficients A, B and C of the signal model given in equation (3) above from a limited signal segment of the sampled space vector.

This model formulation supplies the amplitude of the estimated space vector component through parameter C. Terms with parameters A and B simulate the 50 Hz components formed by aperiodic components. The amplitude of the 50 Hz oscillation decays with time constant τ of the summated impedance $$\tau = \frac{\sum L}{\sum R} \qquad (8)$$

when this consideration is based on a single-pole equivalent circuit diagram of a power supply line supplied by two equivalent machines and having two equivalent impedances.

The set of coefficients A through C is determined by the least squares method, as described, for example, in the dissertation by A. Jurisch, "Digitale Impedanzmessverahren auf der Basis von Identifikationsmethoden" [Digital Impedance Measurement Methods Based on Identification Methods], TH Zittau, 1990, pp. 58–70. From the available sampling values, coefficients A, B and C are to be determined for the model according to equation (3) so that the sum of the error squares between sampling values $y_i$ and sampling values $\hat{y}_i$ calculated according to equation (3) is minimal:

$$J = \sum_{i=k-N}^{k} (y_i - h(\underline{\Theta}_k))^2 \to \text{MIN} \qquad (9)$$

J = quality criterion $h(\theta_k)$ = function according to equation (3)

$$\underline{\Theta}_k = \begin{pmatrix} A_k \\ B_k \\ C_k \end{pmatrix} \qquad (10)$$

(vector with coefficients A, B and C to be determined)

To solve the minimization problem, the quality criterion must be derived by the parameters. Then the following is obtained for the signal model according to equation (3):

$$0 = \sum_{i=k-N}^{k} 2\underline{\gamma}_i^T (y_i - \underline{\gamma}_i \underline{\Theta}_k) \qquad (11)$$

where $$\underline{\gamma}_i^k = \begin{pmatrix} \sin\!\left(\dfrac{2\pi}{T} iT_A\right) \cdot e^{-\frac{iT_A}{\tau}} \\ \cos\!\left(\dfrac{2\pi}{T} iT_A\right) \cdot e^{-\frac{iT_A}{\tau}} \\ 1 \end{pmatrix} \qquad (12)$$

where vector $\gamma_i$ is obtained when equation (3) is represented as a point product of $\gamma_i$ and $\theta_k$. T denotes the period of the system frequency oscillations of the power supply system.

When equation (11) is solved for parameter vector $\theta_k$, equation (13) is obtained for determining the parameter vector, whose substitution into the signal model according to equation (3) leads to the best simulation of the measured signal in the sense of the least squares.

$$\underline{\Theta}_k = \underline{S}_k^{-1} \sum_{i=1}^{k} \underline{\gamma}_i^T y_i \qquad (13)$$

where $$\underline{S}_k = \sum_{i=k-N}^{k} \underline{\gamma}_i^T \underline{\gamma}_i \qquad (14)$$

$$S_k = \begin{pmatrix} \sin^2\left(\frac{2\pi}{T}iT_A\right)\cdot e^{-\frac{iT_A}{\tau}} & \sin\left(\frac{2\pi}{T}iT_A\right)\cos\left(\frac{2\pi}{T}iT_A\right)\cdot e^{-\frac{iT_A}{\tau}} & \sin\left(\frac{2\pi}{T}iT_A\right)\cdot e^{-\frac{iT_A}{\tau}} \\ \cos\left(\frac{2\pi}{T}iT_A\right)\sin\left(\frac{2\pi}{T}iT_A\right)\cdot e^{-\frac{iT_A}{\tau}} & \cos^2\left(\frac{2\pi}{T}iT_A\right)\cdot e^{-\frac{iT_A}{\tau}} & \cos\left(\frac{2\pi}{T}iT_A\right)\cdot e^{-\frac{iT_A}{\tau}} \\ \sin\left(\frac{2\pi}{T}iT_A\right)\cdot e^{-\frac{iT_A}{\tau}} & \cos\left(\frac{2\pi}{T}iT_A\right)\cdot e^{-\frac{iT_A}{\tau}} & 1 \end{pmatrix} \quad (15)$$

When resistance values Wr and reactance values Wx of the positive sequence system after tripping of a respective impedance protection are calculated according to the above considerations, a trajectory in the R-X plane is obtained, and the prerequisites for the occurrence of oscillation can be verified by varying the values of Wr and Wx.

Figure 2:
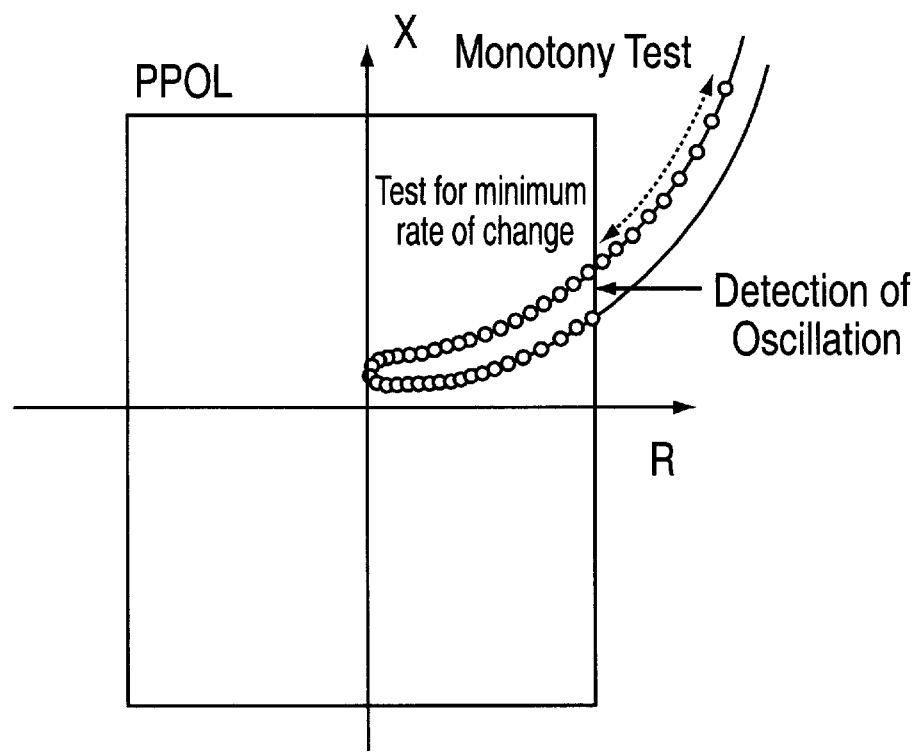
FIG. 2 shows a diagram illustrating the method according to the present invention.

The trajectory test is subdivided into a monotony test and a test for an abrupt signal change. The monotony test checks the course of positive sequence system resistance values Wr which follow one another chronologically for monotony. This test is performed only when oscillation has not yet been detected—the trajectory of the positive sequence system impedance values Z (formed from Wr and Wx) has not yet reached oscillation polygon PPOL (see FIG. 3) because with a synchronous oscillation, the monotony condition would be violated at the point of reversal on the trajectory of the oscillation. During an oscillation, the only check performed is to determine whether the chronologically successive positive sequence system resistance values Wr of the positive sequence system impedance vector have a minimum rate of change. If the positive sequence system impedance vector remains the same during a detected oscillation, it can no longer be an oscillation. FIG. 2 illustrates the reversal of the criteria for the monotony test.

The monotony test is performed over a suitable selected number N of curve points. The following criterion is used:

$$\Delta Wr_{(k-i)} \cdot \Delta Wr_{(k-i-l)} > 0|_{i=0..N} \quad (16)$$

The test for a minimum rate of change uses a threshold value to be established for the change in resistance of the positive sequence system within a sampling interval.

Simultaneously with the monotony test, a test for an abrupt change in signal is performed. Abrupt changes in the positive sequence system impedance vector preclude oscillation. The decision as to whether there is oscillation is made on the basis of the change in resistance Wr and reactance Wx of the positive sequence system as a function of time. These changes are calculated by differentiation of Wr and Wx. Since this differentiation is especially sensitive numerically, good smoothing of measured quantities P, Q and i by the least squares estimator is of crucial importance.

Measured resistance and reactance values Wr and Wx of the positive sequence system are differentiated for the trajectory test by a first-order method:

$$\Delta Wr = Wr_{(k)} - Wr_{(k-l)} \quad (17)$$

$$\Delta Wx = Wx_{(k)} - Wx_{(k-l)}$$

where k denotes the most recent sampling value.

In this block, the following tests are performed:

Test of two ΔWr values obtained from adjacent positive sequence system resistance values Wr for deviations smaller than a threshold value over several intervals. Repeated failure to meet this criterion indicates a non-steady state.

Test of two ΔWx values obtained from adjacent positive sequence system reactance values for deviations smaller than a threshold value over several intervals. If an abrupt change in signal is found in testing the derivations in X direction, the total derivation of the (R, X) trajectory is also tested for an abrupt change. An abrupt change is detected when change dZ has amounted to a component of |Z| determined by the positive sequence system impedance and at the same time the instantaneous value for dZ deviates from dZ formed in the preceding measurement cycle by a threshold value.

These tests check the characteristic patterns of an oscillation state. If all these criteria are met, there is an urgent suspicion of oscillation, and a suspected oscillation signal is generated in analyzer device 16. By defining a suitable interval of time during which these monotony tests are performed, the maximum detectable oscillation frequency is determined.

The test described here permits differentiation between rapid transient phenomena and oscillations. To prevent unwanted operation of the oscillation detection, when oscillation is suspected, a test is also performed to determine whether the trajectory of (R, X), which has been recognized as smooth still has features indicative of a steadily unstable system state.

Figure 3:
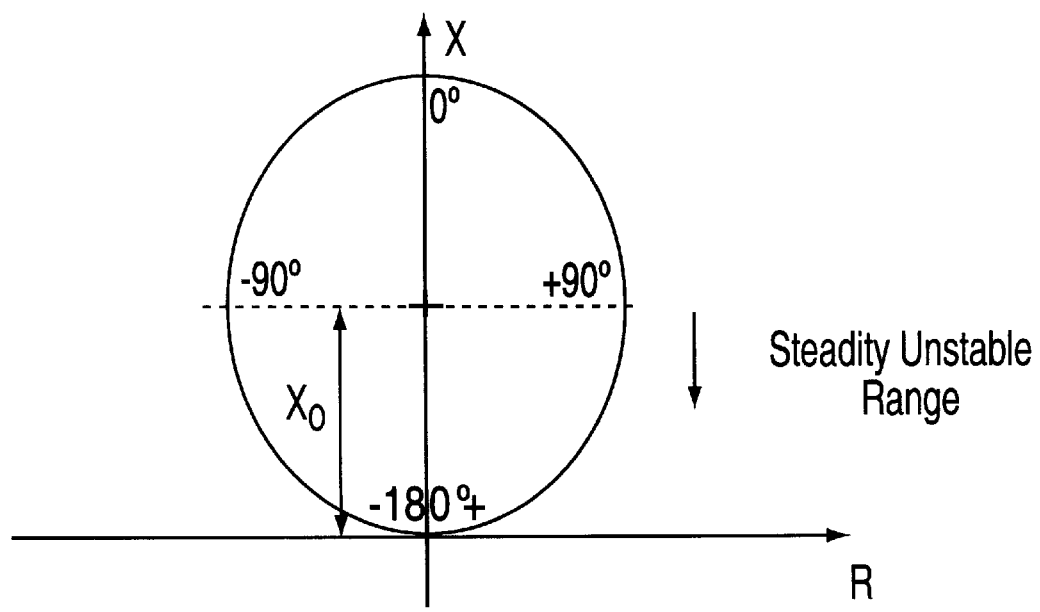
FIG. 3 shows an impedance locus curve in oscillation states.

For detection of differential angle δ between the rotors of the two above-mentioned equivalent machines, the characteristic curve of the impedance measured at the installation site of a protective device operating by the method according to the present invention is used. Assuming that the impedance between the two equivalent machines is purely inductive, the tip of the measured impedance vector at the relay installation site describes an ellipse with a center point on the imaginary axis as a trajectory. The top part of the ellipse is passed through at angle differences up to max. +90°. The bottom part of the ellipse is passed through only at rotor differential angles within the range −90°<180°<+90°. When this part of the ellipse is reached, the system is in a steadily unstable state. This unstable operating point is determined by an estimate of the center of circle from the measured (R, X) trajectory points. If the imaginary component of the center of the circle thus determined is greater than the X values of the measured trajectory, the system is at a steadily unstable operating point and the impedance trajectory may reach the tripping polygon. FIG. 3 illustrates this state of affairs.

The derivations for the trajectory test are formed by a second-order method:

$$dWr = Wr_{(k)} - Wr_{(k-l)} \quad (19)$$

$$dWx = Wx_{(k)} - Wx_{(k-l)}$$

With the derivations of resistance values Wr and reactance values Wx of the positive sequence system obtained by the least squares estimator, the center point of the impedance ellipse on the imaginary axis is estimated for each computation step according to the following formula:

$$\sum_i \left( Wx_1 + \frac{d\,Wr_i}{d\,Wx_i} \cdot Wr_i - Wx_0 \right)^2 \Rightarrow \text{MIN} \quad (20)$$

This equation is obtained from a parametric representation of the trajectory equation with the ellipse angle as a parameter and its derivation with subsequent coefficient comparison. To solve the minimization problem, the quality criterion must be derived by the parameter $W_{x0}$. Then at time k in question, the following is obtained for the signal model according to equation (3) for N past sampling values:

$$0 = -2 \cdot \sum_{i=0}^{N} \left( Wx_{k-i} + \frac{d\,Wr_{k-i}}{d\,Wx_{k-i}} \cdot Wr_{k-i} - Wx_0 \right) \quad (21)$$

$$Wx_0 = \frac{1}{N} \sum_{i=0}^{N} \left( Wx_{k-i} + \frac{d\,Wr_{k-i}}{d\,Wx_{k-i}} \cdot Wr_{k-i} \right)$$

The derivations of the resistance and reactance values of the positive sequence system are formed here by a second-order method according to equation (19).

To differentiate whether the pair of values (Wr, Wx) measured most recently is in the steadily stable or unstable range of the impedance locus curve, the estimated value for $W_{x0}$ is compared with the instantaneous measured value for Wx:

$$\left\{ \begin{array}{l} Wx_0 < 0 \,|\, Wx < Wx_0 \\ Wx_0 > 0 \,|\, Wx > Wx_0 \end{array} \right\} \Rightarrow M = 1; \text{ otherwise } M = 0 \quad (22)$$

Signal M as an oscillation confirmation signal thus becomes active when a steadily unstable curve point has been identified. Number N of curve points used for the estimate is to be defined in a suitable manner. However, the only curve points used to estimate the center point are those where the Wr/Wx ratio is below a threshold value to be defined. This minimizes measurement errors in determination of the center of circle. The curve points for which the above-mentioned requirement is met characterize curve segments with an extremely flat shape. If less than two curve points are suitable for estimating the center of the circle, it can be assumed that the entire curve has an extremely flat shape. Such a curve shape is obtained with system oscillations when the synchronous generated voltages of the two equivalent machines are approximately the same. Thus, in this case, a steadily unstable system state can also be assumed. Oscillation confirmation signal M is also active in this case.

Figure 4:
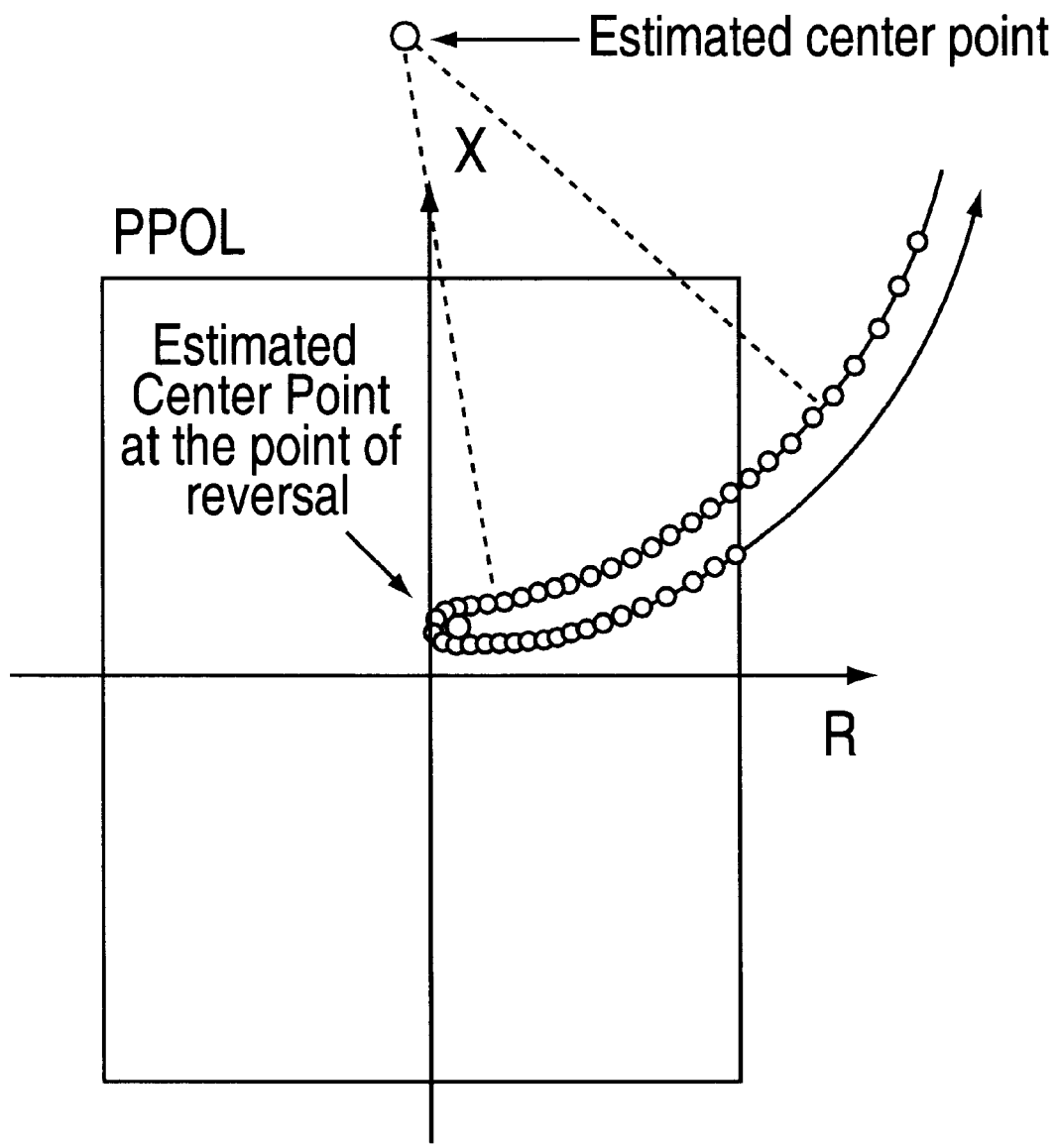
FIG. 4 shows a diagram illustrating how a circle center of a trajectory of a positive sequence system impedance values is estimated.

The test for an unstable curve point can function successfully only when the trajectory segment to be tested does not include any discontinuities or reversals. FIG. 4 shows the center points determined in synchronous oscillation.

FIG. 4 shows clearly that a trajectory center point which would indicate a stable operating point in the R-X plane is estimated at the reversal point. To prevent such a misinterpretation of the estimated center point of the curve in synchronous oscillation, the test for unstable curve point is performed only until an oscillation has been detected, i.e., the trajectory has entered oscillation polygon PPOL. Since only a successful test for unstable curve point can lead to detection of oscillation, this test can be omitted during oscillation that has already been recognized. Since the test for an unstable curve point is performed only when the monotony test and the test for abrupt changes in impedance vector have been concluded successfully, discontinuities in the trajectory segment to be tested can be ruled out.

Figure 5:
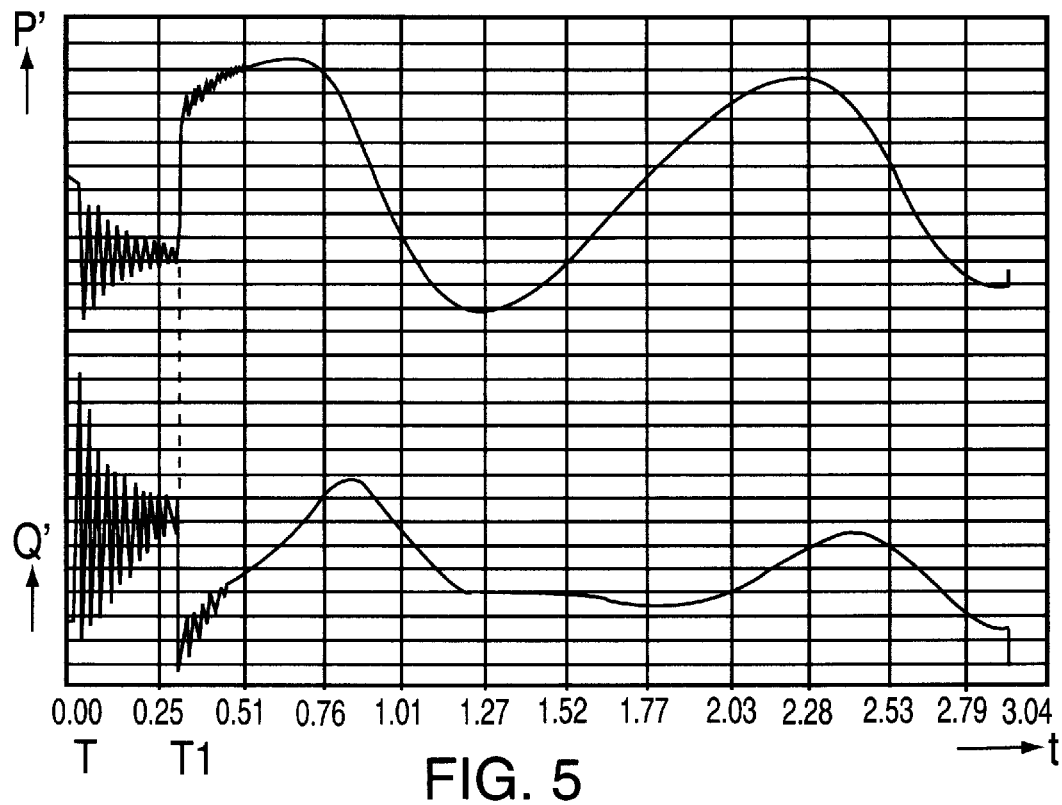
FIG. 5 shows time curves for the active power and reactive power of the positive sequence system.

To further illustrate the method according to the present invention, FIG. 5 shows calculated active power quantity P' and calculated reactive power quantity Q' of the positive sequence system over time t in the event of a three-phase fault. The influence of the 50 Hz component in the event of a fault occurring at time T can be seen clearly. According to FIG. 6, however, the curves of measured active power quantity P and measured reactive power quantity Q of the positive sequence system are improved significantly in the same fault case due to elimination of the 50 Hz components by least squares estimators 5 and 8 according to FIG. 1.

Figure 6:
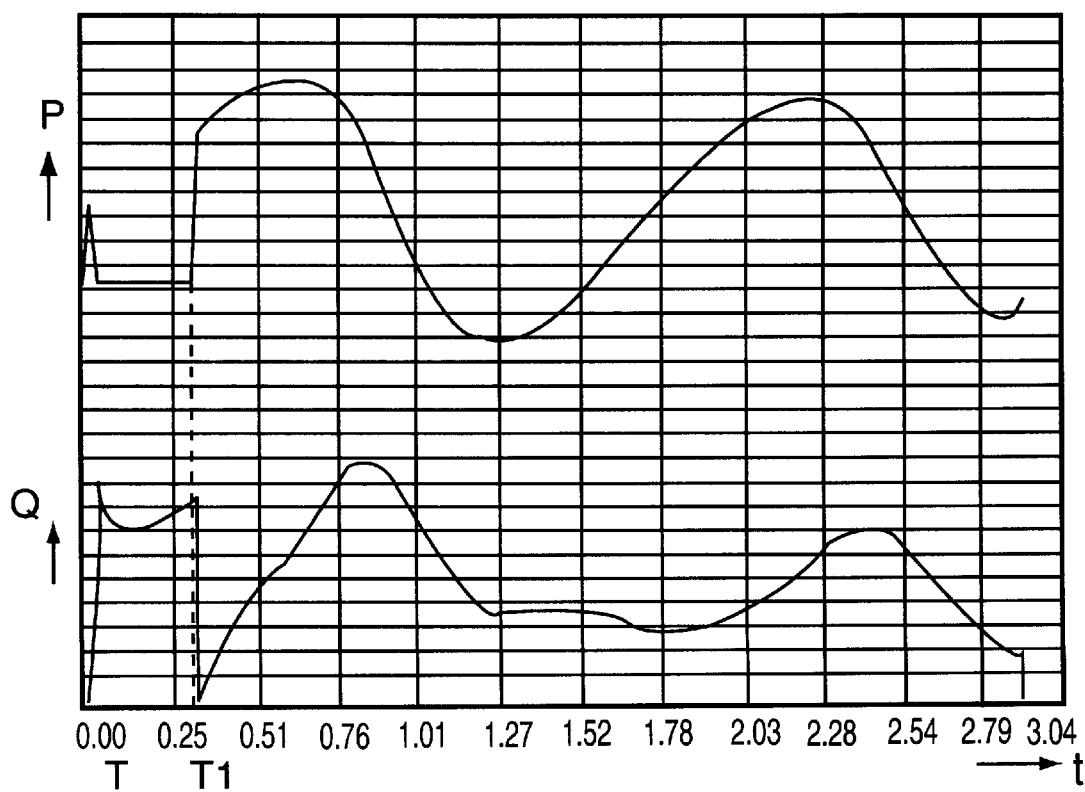
FIG. 6 shows time curves for the measured active power and measured reactive power of the positive sequence system.
Figure 7:
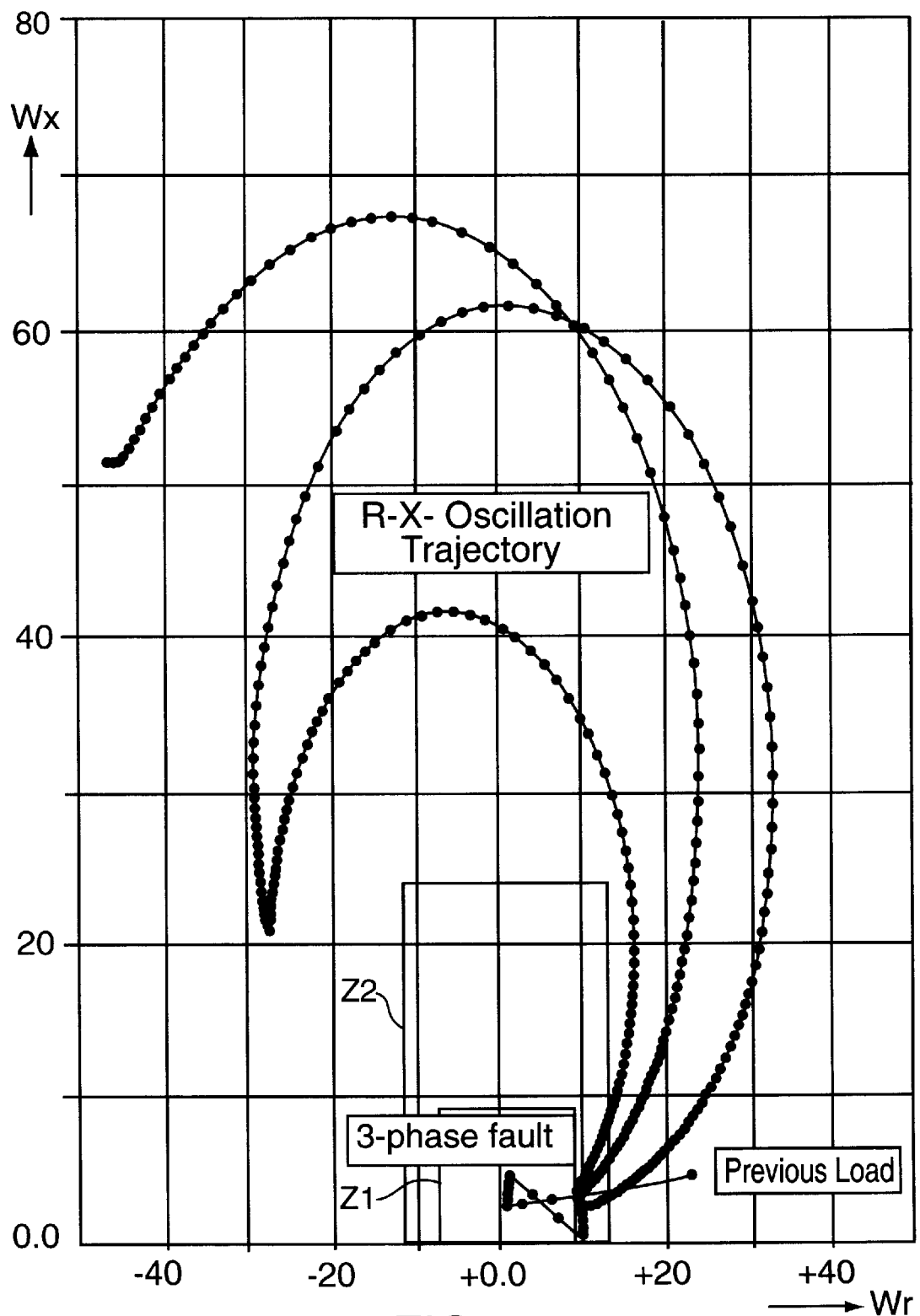
FIG. 7 shows a trajectory of the impedance values of the positive sequence system with oscillations after a three-phase fault.

FIG. 6 shows a power supply system after a three-phase fault as a result of which oscillations occur after detection of a fault. The calculations performed using quantities P and Q and positive sequence system current i lead to a trajectory of values Wr and Wx of the positive sequence system impedance, as shown in FIG. 7, where Z1 denotes the tripping polygon of an internal zone and Z2 denotes the tripping polygon of an external zone of a respective impedance protection device.

What is claimed is:

1. A method for obtaining a power swing signal indicating a power swing in an electric power supply system, comprising the steps of:

sampling phase currents and phase voltages;

determining phase current sampling values and phase voltage sampling values from the sampled phase current and the sampled phase voltages;

determining impedance values from the phase current sampling values and the phase voltage sampling values;

testing the impedance values with regard to positions of the impedance values relative to a power swing polygon in response to an excitation;

forming current space vectors and voltage space vectors of a positive sequence system of the power supply system from the phase current sampling values and the phase voltage sampling values;

forming an active power quantity of the positive sequence system using the current space vectors and the voltage space vectors, the active power quantity being proportional to an instantaneous value of an active power of the positive sequence system;

forming a reactive power quantity of the positive sequence system using the current space vectors and the voltage space vectors, the reactive power quantity being proportional to a reactive power of the positive sequence system;

forming a measured active power quantity by eliminating system frequency components from the active power quantity via a least squares estimate;

forming a measured reactive power quantity by eliminating the system frequency components from the reactive power quantity via the least squares estimate;

forming a current quantity of the positive sequence system from the current space vectors of the positive sequence system;

forming a measured current quantity of the positive sequence system from the current quantity via the least squares estimate;

squaring the measured current quantity of the positive sequence system;

obtaining resistance values of the positive sequence system by forming a quotient of the measured active power quantity and the squared measured current quantity of the positive sequence system;

forming chronologically successive impedance values of the positive sequence system by pairing in time resistance values of the positive sequence system and reactance values of the positive sequence system;

testing the chronologically successive impedance values of the positive sequence system for monotony;

testing the chronologically successive impedance values of the positive sequence system for abrupt changes;

if monotony is found and no abrupt changes are found, generating a suspected power swing signal;

determining a center point of a circle of a curve path formed by the chronologically successive impedance values of the positive sequence system with respect to a predetermined impedance value of the positive sequence system by estimation from the chronologically successive impedance values of the positive sequence system;

if an imaginary component of the center point of the circle exceeds an absolute value of one of the reactance values of a respective one of the chronologically successive impedance values of the positive sequence system, generating an power swing confirmation signal; and if the suspected power swing signal and the power swing confirmation signal are generated at a same time, forming the power swing signal if a last one of the chronologically successive impedance values formed is within the power swing polygon.

2. The method according to claim 1, further comprising the steps of:

monitoring the chronologically successive impedance values of the positive sequence system for whether a minimum rate of change is maintained if the chronologically successive impedance values lie within the power swing polygon; and canceling the power swing signal if a monitored rate of change is lower than the minimum rate of change.

* * * * *